(12) United States Patent
Gierak et al.

(10) Patent No.: US 8,927,942 B2
(45) Date of Patent: Jan. 6, 2015

(54) ION SOURCE, NANOFABRICATION APPARATUS COMPRISING SUCH SOURCE, AND A METHOD FOR EMITTING IONS

(75) Inventors: Jacques Gierak, Le Plessis Pate (FR); Nicolas Allemandou, La Biolle (FR); Klaus Hasselbach, Grenoble (FR); Jean-Paul Leggeri, Grenoble (FR); Guillaume Donnier-Valentin, Pommiers la Placette (FR); Stephen Purcell, Caluire (FR); Pauline Gavand, Oullins (FR)

(73) Assignees: Centre National de la Recherche Scientifique—CNRS, Paris Cedex (FR); Universite Claude Bernard Lyon, Villeurbanne (FR)

( * ) Notice: Subject to any disclaimer, the term of this patent is extended or adjusted under 35 U.S.C. 154(b) by 0 days.

(21) Appl. No.: 14/124,408
(22) PCT Filed: Jun. 5, 2012
(86) PCT No.: PCT/EP2012/060578
§ 371 (c)(1), (2), (4) Date: Jan. 29, 2014
(87) PCT Pub. No.: WO2012/168225
PCT Pub. Date: Dec. 13, 2012

(65) Prior Publication Data
US 2014/0175301 A1 Jun. 26, 2014

(30) Foreign Application Priority Data
Jun. 6, 2011 (EP) ..................................... 11305686

(51) Int. Cl.
*H01J 27/00* (2006.01)
(Continued)

(52) U.S. Cl.
CPC ............... *H01J 37/08* (2013.01); *H01J 27/024* (2013.01); *H01J 27/22* (2013.01);
(Continued)

(58) Field of Classification Search
CPC ........... H01J 27/26; H01J 37/08; H01J 27/22; H01J 2237/0805; H01J 27/022; H01J 2237/0807; H01J 2237/0815; H01J 2237/0827
USPC ...... 250/423 R, 424, 425, 423 F; 315/111.01, 315/111.81
See application file for complete search history.

(56) References Cited

U.S. PATENT DOCUMENTS 5,055,696 A * 10/1991 Haraichi et al. ........... 250/492.2
7,368,727 B2 5/2008 Ward
(Continued)

FOREIGN PATENT DOCUMENTS

EP 1936653 6/2008
WO WO 2010/029270 3/2010

OTHER PUBLICATIONS

International Search Report for PCT/EP2012/060578, report dated Sep. 4, 2012.
(Continued)

*Primary Examiner* — Michael Maskell
(74) *Attorney, Agent, or Firm* — Miller, Matthias & Hull LLP (57) ABSTRACT

A ion source comprises: a chamber, an injection to inject matter into the chamber, wherein said matter comprises at least a first species, a tip with an apex located in the chamber, wherein the apex has a surface made of a metallic second species, a generator to generate ions of said species, and a regulation system adapted to set operative conditions of the chamber to alternatively generate ions from the gaseous first species, and ions from the non-gaseous metallic second species.

19 Claims, 8 Drawing Sheets

(51) Int. Cl.
*H01J 37/08* (2006.01)
*H01J 27/02* (2006.01)
*H01J 27/22* (2006.01)
*H01J 3/18* (2006.01)
*H01J 3/26* (2006.01)
*H01J 37/05* (2006.01)
*H01J 37/317* (2006.01)

(52) U.S. Cl.
CPC .. *H01J 3/18* (2013.01); *H01J 3/26* (2013.01); *H01J 27/022* (2013.01); *H01J 37/05* (2013.01); *H01J 37/317* (2013.01); *H01J 37/3174* (2013.01); *H01J 2237/0807* (2013.01); *H01J 2237/0815* (2013.01); *H01J 2237/0827* (2013.01)
USPC ..... 250/423 R; 250/424; 250/425; 250/423 F (56) References Cited

U.S. PATENT DOCUMENTS

| 7,521,693 | B2 | 4/2009 | Ward et al. |
| 7,589,328 | B2 | 9/2009 | Frosien |
| 2009/0020708 | A1 | 1/2009 | Winkler |
| 2009/0152462 | A1 | 6/2009 | Ishitani et al. |
| 2009/0173888 | A1 | 7/2009 | Shichi |
| 2010/0108902 | A1* | 5/2010 | Frosien et al. ............ 250/396 R |
| 2010/0176296 | A1* | 7/2010 | Kaito et al. ................... 250/307 |

OTHER PUBLICATIONS

Kuo, et al.; *Gas Field Ion Source from an IR/W<111> Single-Atom Tip*; article; 2008; pp. 1-3; Applied Physics Letter, 92, 063106 (2008); American Institute of Physics.

* cited by examiner

ION SOURCE, NANOFABRICATION APPARATUS COMPRISING SUCH SOURCE, AND A METHOD FOR EMITTING IONS

CROSS REFERENCE TO RELATED APPLICATIONS

This application is a 35 USC §371 U.S. national stage filing of International Patent Application No. PCT/EP2012/060578 filed on Jun. 5, 2012, and claims priority under the Paris Convention to European Patent Application No. EP 11305686.5 filed on Jun. 6,2011.

FIELD OF THE DISCLOSURE

The instant invention relates to ion sources, nanofabrication apparatus comprising such sources, and methods for emitting ions.

BACKGROUND OF THE DISCLOSURE

In particular, the instant invention is related to gas field ion sources (GFIS).

U.S. Pat. No. 7,589,328 already describes such a gas field ion source. This source is described as being able to provide alternatively a beam of ions from a first gas and a beam of ions from a second gas. Although the technology of gas field ion sources appears promising, because it is foreseeable that this technique could provide new services to the nano-structuration industry, it is still however quite confidential.

The instant invention has notably for object to democratize the use of this technology.

SUMMARY OF THE DISCLOSURE

To this aim, according to the invention, it is provided a ion source comprising:
- a chamber having at least one entry port and one exit aperture,
- an injection adapted to inject matter into the chamber through the entry port, wherein said matter comprises at least a first species,
- a tip having an apex located in the chamber, wherein the apex has a surface made of a metallic second species, wherein said first species and said metallic second species have different ionization voltages,
- a generator, adapted to apply a voltage to said tip to ionise species inside said chamber, thereby generating ions of said species,
- an extractor, adapted to move said ions out from the chamber through the exit window,
- a regulation system adapted to set operative conditions of the chamber, including at least a temperature and a pressure inside the chamber, and said voltage, to alternatively generate:
  - in a first operative setting, ions from the gaseous first species,
  - in a second operative setting, ions from the non-gaseous metallic second species.

With these features, the gas field ion source is in fact integrated in a more common system wherein a metallic non-gaseous species is emitted from the very same tip. The end-user would therefore be provided with a versatile tool which offers the function (s)he is used to, as well as gas field ion source technology, as a compact and economically viable solution. This would open new possibilities for the end user.

In particular, in the first operative setting, where the noble first species is ionized, the second species is not ionisable. In the second operative setting, where the metallic second species is ionized, the first species is not ionisable.

In the present disclosure, a voltage is characterized both by its absolute value and its polarity.

In some embodiments, one might also use one or more of the following features:
- the ion source comprises a thermal system, adapted to place the chamber at a temperature,
- the first species has a lower vaporization temperature and a higher ionisation voltage than the metallic second species,
- the regulation system comprises:
  - a voltage regulator adapted to set the voltage at least at a first value between the ionisation voltages of the metallic second species and the first species, and at a second value greater than the ionisation voltage of the first species,
  - a temperature regulator, adapted to set the temperature at least at a first value between the vaporization temperature of the first species and of the metallic second species and a second value greater than the vaporization temperature of the metallic second species;
- said first species is Helium or Hydrogen;
- said first species is Argon or Neon;
- the tip comprises a core covered by a layer of said metallic second species, which is liquid in the second operative setting;
- the apex is made of said metallic second species, which is solid in the second operative setting;
- the ion source further comprises a hollow tube carrying the tip and having a first end forming the entry port;
- the injection is adapted to inject matter into the chamber through the entry port, wherein said matter further comprises at least a third species,
- wherein the regulation system is adapted to set operative conditions of the chamber in a third operative setting to generate ions from the gaseous third species [In particular, in any of the first and second operative settings, the third species is not ionisable. In the third operative setting, none of the first and second species is ionisable];
- in the first operative setting, the third species is frozen.

According to another aspect, the invention relates to a nanofabrication apparatus comprising:
- a sample holder, adapted to receive a sample to be formed,
- such a ion source,
- an electrostatic focusing and scanning charged particles optics, located between the ion source and the sample holder, operable to guide ions emitted from the source toward the sample holder.

In some embodiments, one might also use one or more of the following features:
- ions of the first species are used to image the sample received by the sample holder;
- ions of the first species are used to form the sample received by the sample holder;
- ions of the metallic second species are used to form the sample received by the sample holder by etching;
- ions of the metallic second species are used to form the sample received by the sample holder by deposition;
- the nanofabrication apparatus further comprises a detecting system adapted to detect the incoming ion beam at the sample holder, the detecting system having a known relative position to the sample,
- and the regulation system is adapted to set operative conditions of the source and/or the optics based on a detection output from the detecting system;

the detection system has an amplifier, adapted to amplify an ion beam from the ion source, and a detector adapted to measure a signal emitted by the amplifier.

According to another aspect, the invention relates to a method for emitting ions comprising:

providing a chamber having at least one entry port and one exit aperture, and a tip having an apex located in the chamber, wherein the apex has a surface made of a metallic second species, injecting matter into the chamber through the entry port, wherein said matter comprises at least a first species, wherein said first species and metallic second species have different ionization voltages, setting operative conditions of the chamber to a first operative setting, including at least a temperature and a pressure inside the chamber, and a voltage, to generate ions of said first species, applying said voltage to said tip to ionise species inside said chamber, thereby generating ions of said gaseous first species, moving said ions out from the chamber through the exit aperture, setting operative conditions of the chamber to a second operative setting, including at least a temperature and a pressure inside the chamber, and said voltage, to generate ions of said metallic second species, applying said voltage to said tip to ionise species inside said chamber, thereby generating ions of said non-gaseous metallic second species, moving said ions out from the chamber through the exit aperture.

According to yet another aspect, the invention relates to a ion source comprising:

a chamber having at least one entry port and one exit aperture, a thermal system, adapted to place the chamber at a temperature, an injection adapted to inject matter into the chamber through the entry port, wherein said matter comprises at least two different species, wherein a first species has a lower vaporization temperature and a higher ionisation voltage than a second species, a tip located in the chamber, a generator, adapted to apply a voltage to said tip to ionise said matter inside said chamber, thereby generating ions of said species, a voltage regulator adapted to set the voltage at least at a first value between the ionisation voltages of the second and first species, and at a second value greater than the ionisation voltage of the first species, an extractor, adapted to move said ions out from the chamber through the exit aperture, wherein the temperature system comprises a temperature regulator, adapted to set the temperature at least at a first value between the vaporization temperature of the first and second species and a second value greater than the vaporization temperature of the second species.

Hence, for this aspect, voltage and temperature regulations are used in order to discriminate which of the two gaseous species will be ionised. This enables to ensure that only one of these two species will be ionised, thus preventing any contamination of the treated sample.

According to yet another aspect, the invention relates to a gas-field ion source comprising:

a chamber having at least one entry port and one exit aperture, an injection adapted to inject matter into the chamber through the entry port, wherein said matter comprises at least a first species which is gaseous under operative conditions, a tip located in the chamber, a generator, adapted to apply a voltage to said tip to ionise species inside said chamber, thereby generating ions of said species, an extractor, adapted to move said ions out from the chamber through the exit aperture, a hollow tube carrying the tip and having a first end forming the entry port.

In this way, the gas to be ionized is injected in the chamber from behind the tip's apex, therefore in the close neighbourhood of the tip's apex, which will maximize the polarization forces and the ionisation efficiency. In particular, the tube and the tip are in electrically conductive contact so as to be placed at the same potential.

BRIEF DESCRIPTION OF THE DRAWINGS

Other characteristics and advantages of the invention will readily appear from the following description of two of its embodiments, provided as non-limitative examples, and of the accompanying drawings.

On the drawings.

On the different Figures, the same reference signs designate like or similar elements.

DETAILED DESCRIPTION

Figure 1:
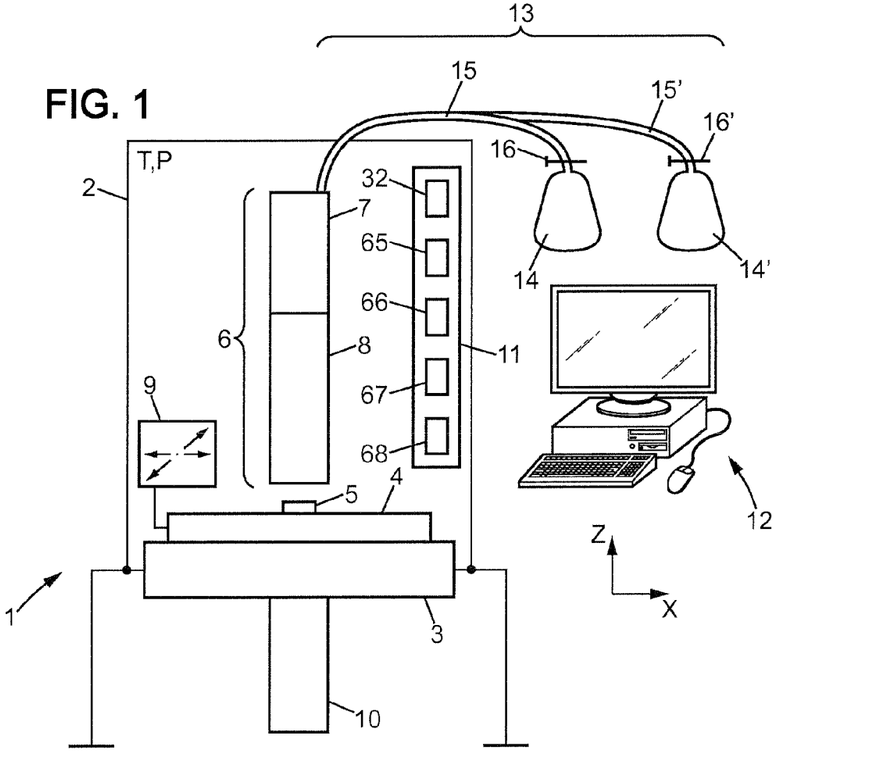
FIG. 1 is a schematic view of a nano-fabrication apparatus.

FIG. 1 is a schematic view of a nano-fabrication apparatus 1. The apparatus 1 comprises an enclosure 2 which receives components such as a table 3 to receive a sample holder 4. In use, the sample holder 4 receives, in a precise location, a sample 5 to be processed. A forming system 6 is placed facing the sample 5. The forming system 6 comprises a ion source 7 adapted to emit a beam of ions as will be described in more details below, and an electrostatic optics 8. The electrostatic optics 8 is placed between the ion source 7 and the sample 5, to displace and shape (scanning and focussing through electrostatic deflection) the beam emitted by the ion source for the intended purpose.

A displacement system 9 can be used to move the sample holder 4 with respect to the source 7 in three directions as well as in rotation around one or more axes, as needed. In order to ease the description, the sample holder 4 will be referred to as providing a horizontal surface extending in the X-Y plane, with the ion beam emitted globally vertically downward from the source 7 toward the sample 5. The vertical upward direction is direction Z. However, this is exemplary only.

The source 7 is a refrigerated source, as will be explained in more details below. Hence, an overall temperature T is settable in the enclosure. A vacuum system 10, comprising for example a pump located beneath the sample holder 4, can be used to set the overall pressure in the enclosure, for example up to ultra high vacumm ($10^{-10}$ mbar). The vacuum system may also comprise other pumps (not shown), to set different vacuum levels in various locations in the system (such as, for example, at the source emitting part).

Overall, the source is provided with a regulation system 11 which is connected to the various equipments of the source (which will be described below) to set the operative conditions of these elements. The regulation system 11 needs not be centralised, but can be distributed among the equipments. A user interface, such as a personal computer 12, may be used by a user to interact with the regulation system 11.

The apparatus 1 further comprises a gas supply system 13, which may be partly provided outside the enclosure 2, as shown. The gas supply system 13 comprises a tank 14 of a first gas, and a line 15 connecting this tank 14 to the ion source 7. A first valve 16 can be used between the first tank 14 and the ion source 7, to alternatively switch on or off the supply of the first gas to the ion source 7. The first gas is for example a heavy noble gas such as Argon or Neon.

According to the present embodiment, the gas supply system 13 further comprises a tank 14' of a second gas, and a line 15' connecting this tank 14' to the ion source 7 (possibly through part of said first line 15). A second valve 16' can be used between the second tank 14' and the ion source 7, to alternatively switch on or off the supply of the second gas to the ion source 7. The second gas is for example a light noble gas such as Helium or Hydrogen.

Figure 2:
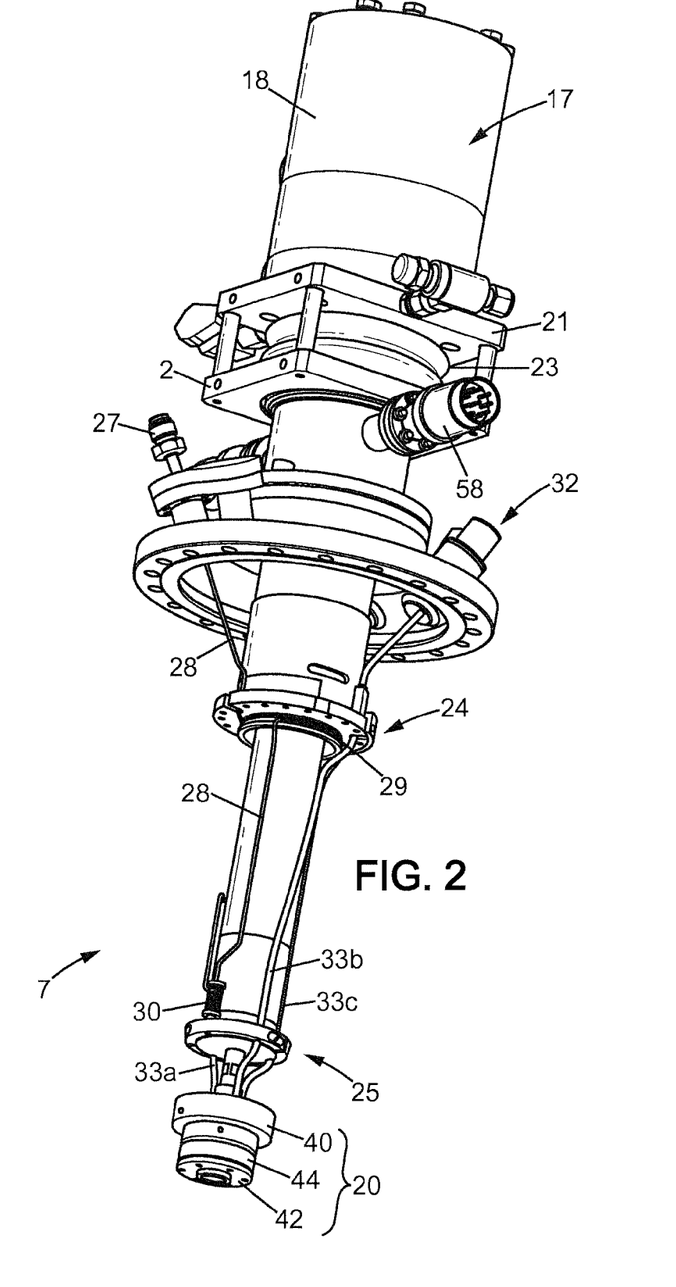
FIG. 2 is a perspective view of a ion source according to a first embodiment.
Figure 3:
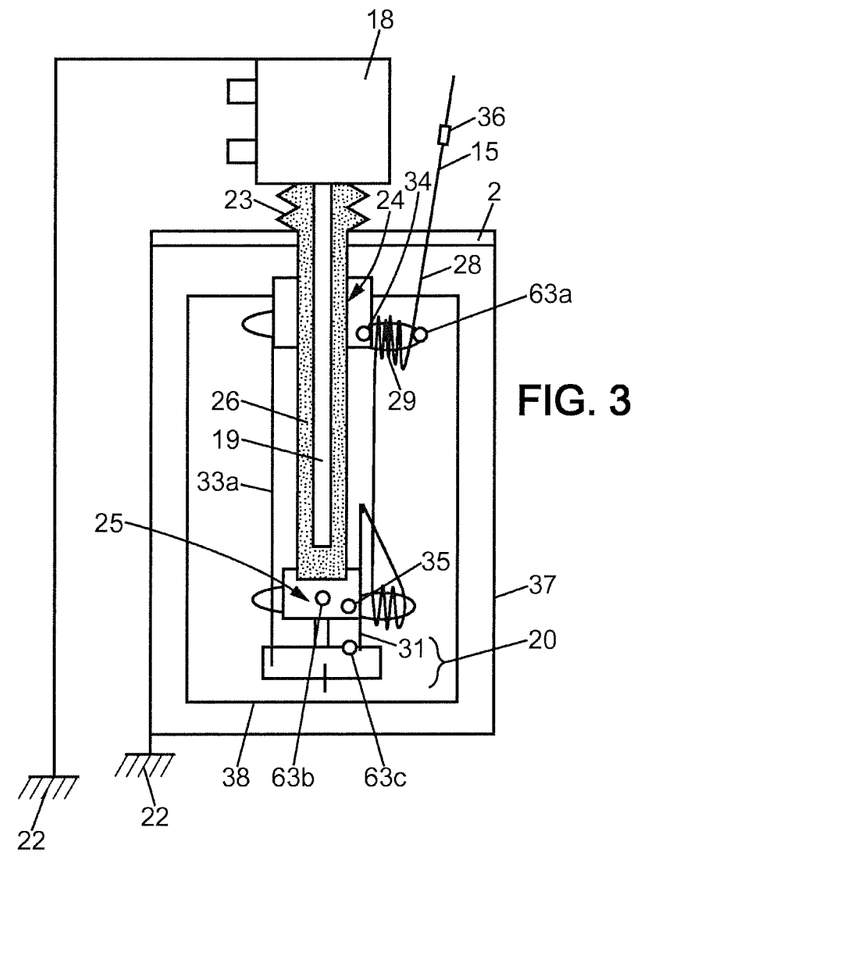
FIG. 3 is a schematic axial sectional view through the source of FIG. 2.

Turning now to FIGS. 2 and 3, a refrigerated source according to a first embodiment will be described. The source is refrigerated using a cooling system 17. According to this first embodiment, the cooling system 17 comprises a mechanical cooling system, for example of the Gifford Mac Mahon type. The cooling system which is described below can for example be designed by adapting a commercially-available Gifford Mac Mahon or a low-vibration 4 Kelvin Pulse Tube cooling system, for example obtained respectively from Advanced Research Systems, 7476 Industrial Parkway, Macungie, Pa. 18062, USA, or CRYOMECH, 113 Falco drive, Syracuse, N.Y. 13211, USA. As visible on FIG. 3, the cooling system comprises a head 18 which is provided outside the enclosure and a cryocooler 19 extending downward from the head 18 inside the enclosure toward the emission part 20 of the source. In order to minimize vibration transfer to the enclosure (and hence its warming), the head 18 of the cooling system may be mechanically uncoupled from the enclosure 2. Namely, the head 18 will be mechanically supported by a structure 21 anchored in the ground, the enclosure 2 will be separately anchored in the ground, and a mechanical uncoupling system, such as bellows 23 will be provided between the two.

The cooling system 17 is a two-stage cooling system which comprises a first stage 24 and a second stage 25. The powers $W_{24}$, $W_{25}$ applied to each stage and hence the resulting temperatures at each stage can be controlled independently by a temperature regulator 66 of the regulation system 11. In particular, each stage 24, 25 comprises a respective heater 34, 35, which is powered independently and controllably in order to precisely define the temperature at each stage. A suitable fluid (in particular a compressible gas) 26 can be provided between the cryocooler 19 and the first and second stages 24, 25, in order to convectively transfer the temperature between the cryocooler and the respective stage. Further, a pressure adjustment system 58 may be used to regulate the pressure of this gas, and hence the level of convective transfer. Compensated bellows may in such cases be used.

The gas supply line 15 enters the enclosure 2 at an interface 27, and is connected to an internal line 28 which extends from the interface to the emission part 20. The internal line 28 comprises for example a long narrow hollow tube, such as a capillary tube. The capillary tube 28 (and the gas therein) is thermalized at each of the stages 24, 25. In particular, the capillary tube is fixed in contact with a cold part of the respective stage. Fixation is for example made by welding the tube if it's made of solderable material, such as for example a suitable copper alloy. For example, the tube is wound and fixed around the first stage as a coil 29, in order to maximize the thermal exchange surface between the tube and the first stage. A similar behaviour can be provided at the second stage (FIG. 3). Alternatively (FIG. 2), a coil 30 of the second stage is wound around the straight tube 28.

The electrically conductive tube 28 can be connected to an electrically insulating tube 31 which is provided to the emission part 20, as will be explained later.

As shown on FIG. 3, a filter 36 can be provided on the gas feed line 15, and in particular as close as possible to the emission part 20. It is for example provided just before the enclosure 2. This filter 36 can also be commanded by the regulation system 11 to further purify the gas arriving at the emission part. This filter could be used in case two different gas are used, as shown in the present embodiment, or even when only one gas is used since, in any case, commercially available tanks are never 100% pure, and/or the gas can be contaminated between the tank and the emission part 20. A suitable filter could for example be a product commercialised by the company Nupure, 67 Iber Road, Unit 107, Ottawa ON K2S 1E7 Canada under the reference Nupure Eliminator™ Model 600 CG.

In order to extract ions, different voltages must also be applied to different parts of the emission part 20. A generator 32 can be used to generate voltages which will have to be conveyed to the emission part 20. A voltage regulator 65 of the regulation system 11 is used to set the polarity and the absolute value of the voltage. The present embodiment uses three electrically conductive lines 33a, 33b, 33c to convey the power to the emission part 20. These lines are also thermalized at the first and second stages 24, 25 of the machine. Please note that only line 33a is visible on FIG. 3.

In order to improve the cooling efficiency, the cooling system 17 may further include a shielding system which surrounds the cold parts (not visible on FIG. 2). In particular, the shielding system may comprise one or several radiation shields 38, situated at the center of the outer vacuum container 37. The shields 38, made out of copper, comprise apertures in order to allow the emitted ion beam to exit from the ion source 7 (see the opening 39 on FIG. 4).

Figure 4:
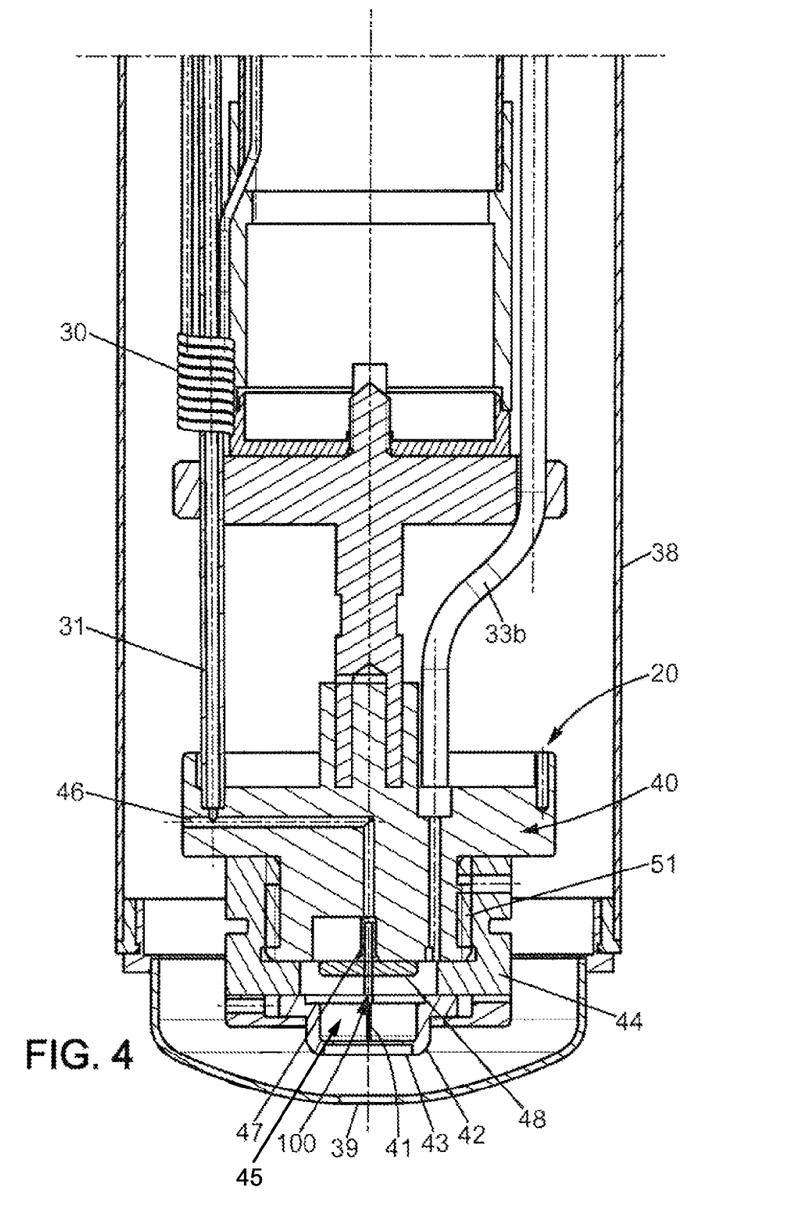
FIG. 4 is an enlarged view of the bottom part of FIG. 3.

FIG. 4 now shows in more details the emission part 20 of the ion source. The internal shield 38 is visible along with the above-mentioned opening 39 therein. The emission part 20 comprises in particular a tip holder 40. In the present section, the insulated capillary tube 31 bringing the gas and one electrical line 33b are visible. The tip holder 40 has a top face 40a which receives these lines, and an opposed bottom face which carries a tip 41, which will be described in more details below. An extraction electrode 42 is provided around the tip, and defines an aperture 43 through which the ion beam will be emitted. The extraction electrode 42 can be assembled to the tip holder 40 through an electrically insulating buffer 44 mounted therebetween. The bottom part of the tip holder 40, the lateral part of the buffer 44 and the extraction electrode 42 together surround a small open chamber 45 in which ions will be generated. In the present geometry, the distance between the apex of the tip and the extraction electrode plane is about 1 millimeter (mm).

Figure 5:
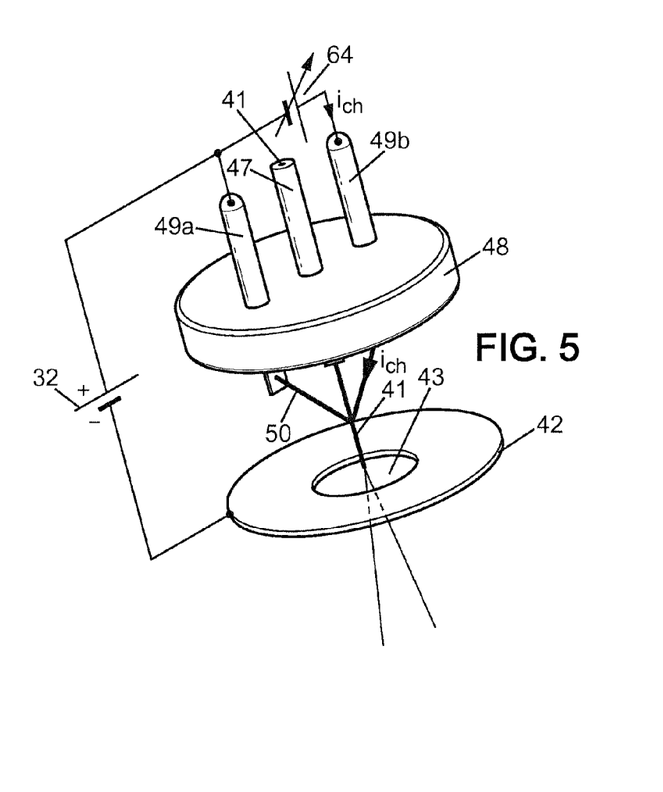
FIG. 5 is a perspective enlarged view of the tip-carrying portion of the source.

A gas channel 46 is provided in the tip holder 40, extending from the capillary tube 31 to the bottom face of the tip holder 40, where it is in fluid communication with a tube 47. As shown in particular on FIG. 5, a support 48 is provided in electrically insulating material (alumina), which receives, passing therethrough, the hollow tube 47, as well as two electrical contacts 49a and 49b (out of plane on FIG. 4). The hollow tube 47 carries the tip 41. The bottom end of the tube 47 forms an entry port 100 for the gas into the chamber. The electrical contacts 49a and 49b are each connected to a respective end of an electrical wire 50 which has a portion which surrounds the tip 41. This portion for example comprises a loop with a reduced wire cross-diameter for local heating by Joule effect. The back ends of the electrical contacts 49a and 49b are connected to the respective electrical lines 33a and 33c. The electrical line 33b passes through the tip holder and contacts the extraction electrode 42.

Figure 6:
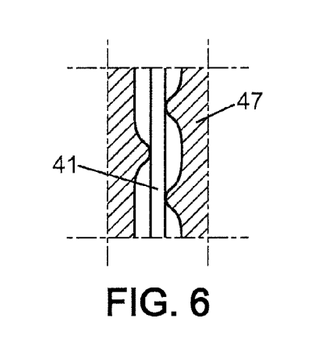
FIG. 6 is a further enlarged sectional view of the assembly of the tip and tip-carrying portion.

In particular, the tip 41 is fixed inside the hollow tube 47 so as to allow passage of gas around the tip 41, from the channel 46 to the chamber 45 through the tube 47 around the tip 41. As schematically shown on FIG. 6, this is for example done by partial rough crimping. The tube internal diameter can be about 100 micrometers, whereas the tip external diameter will be about half of it, i.e. about 50 micrometers in the present case.

Back to FIG. 4, the tip holder 40 can also house a heater 51 which can be commanded by the regulation system 11 to locally warm up the tip holder 40.

Figure 7:
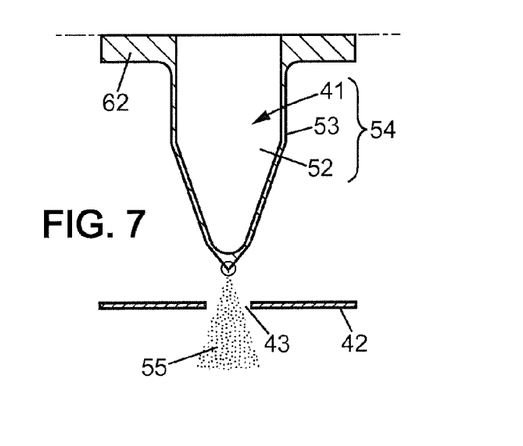
FIG. 7 is a further enlarged schematic view of the tip's apex.

The tip 41 can be provided as a tip for liquid metal ion sources (LMIS). For example, its apex 54 will comprise a core 52 of refractory metal, such as tungsten, totally covered with a thin layer 53 of a metal to be used to process the sample 5, such as Gallium or Gold. This material is able to be liquefied by locally applying heat, to flow over the tip apex. This metal is more malleable than the material of the core, and is allowed to be shaped to the desired geometry of the apex of the tip, and/or to emit ions of this metal.

Figure 8:
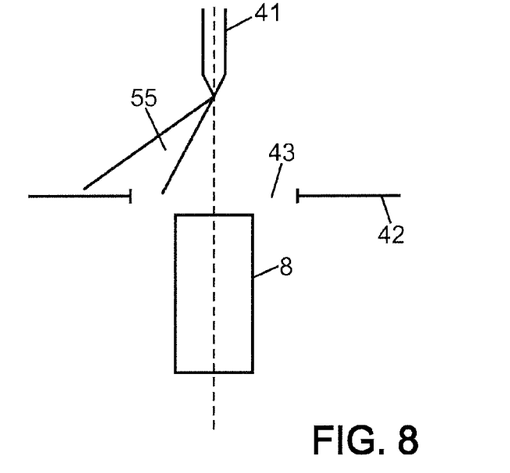
FIG. 8 is a schematic view of a beam emission calibration system.

FIG. 8 now shows an additional feature of the first embodiment, which may be used within the present frame. FIG. 8 schematically shows the tip 41, the extraction electrode 42, the electrostatic optics 8, the sample holder 4 and the sample 5. FIG. 8 also schematically shows a ion beam 55 emitted from the tip 41. A detection system 70 is provided in known geometric relationship to the sample 5. It is for example carried by the sample holder 4. Using the piezo-electrical displacement device 9, one can place the detection system 70 under the ion beam, below the optics 8. The detection system 70 comprises a suitable amplifier 56, for example a multichannel plate, which is able to generate a current of the micro-ampere order from a few incoming ions, thereby amplifying the signal by about $10^6$. A detector 69, such as a current detector, is able to detect the amplified signal.

The detection system 70 can be used to determine the best emission parameters for the ion source, which would enable the ion beam to be emitted toward the sample 5 to be processed, notably tilt and alignment of the tip and electrical parameters of the optics 8. In a calibration mode, the operating parameters of the tip and optics will be scanned in order to have the beam 55 scan the area below the tip. The tip will be considered calibrated when most of the ion beam reaches the sample. This is in fact when the current signal detected by the detector 69 for the signal amplified by the amplifier 56 is highest. The operating parameters of the tip corresponding to this highest signal will be memorized and later entered in the tip regulator 67 and optics regulator 68 of the regulation system 11 for processing the sample 5. The displacement device 9 will place the amplifier 56 in or out of the way of the ion beam, respectively for calibration or processing purposes. It appears that the use of a detector located between the optics and the sample, and in known geometrical relationship to the sample, to determine the optimal characteristics of the ion beam to be emitted toward the sample, is original in the ion source application. In particular, for sources emitting low currents (ASIS and/or GFIS), using an amplifier in the detector.

Below, one operation of the above apparatus will be described.

The apparatus is first operated in Gas-Field Helium Ion Source (Helium GFIS). The purpose of this operation is to image the sample 5 using Helium ions.

The regulation system 11 is used to set operative conditions to a first setting. In particular, the valve 16 from the Helium tank 14 is opened, the valve 16' of the Argon tank 14' is closed, the vacuum system is set to set the pressure in the vicinity of the apex of the tip at a suitable pressure. The pressure is chosen not to be too high, so as not to generate a plasma, nor too low, in order to obtain a sufficient concentration of gas atoms condensed on the tip. Typical values are about $10^{-6}$ mbar-$10^{-4}$ mbar. The cooling system 17 is set to a suitable operative point so that the incoming gas atoms will condense on the tip, where they are maintained by low interaction electrostatic forces. The amount of power to be input on both stages 24, 25 is determined based on the loading graph of the cooling system. For example, the temperature is set in the chamber 45 to an optimum suitable to emit a beam of Helium ions, for example to a temperature of about 5 K. Helium gas will be made to flow from the tank 14 to the chamber 45 through the capillary tube 28, where it is thermalized at a first temperature at the first stage 24, then to a second, colder temperature at the second stage 25. Possible impurities are filtered by the filter 36. Use of such a filter enables to reduce the concentration of impurities in the chamber. In particular, impurities with a lower ionization voltage than Helium ought to be pumped or filtered out, because they would be ionized in the chamber preferably to Helium, and thus consume power which could then not be dedicated to ionize Helium. Use of a filter located at the entrance of the enclosure 2 of a GFIS appears original per se.

The gas enters the alumina capillary tube 31, the channel 46 through the tip holder 40, the tube 47 where it flows around the pin 41 into the chamber 45. The gas pressure in the channel 46 is for example about $10^{-3}$-$10^{-1}$ mbar. The length of capillary tube at the first or second stage may be between a few centimeters to about one meter, depending in particular of the available power and the gas flow.

The regulation system 11 is further used to apply a voltage difference between the tip 41 and the extraction electrode 42. As shown on FIG. 5, the high tension lines 33a and 33c are used to place the tip 41 at a first potential, and the high tension line 33b is contacted to the extraction electrode 42 to set a potential difference between the tip and the extraction electrode. This potential difference is for example of the order of 5 kV, where the tip voltage determining the energy of the emitted ions can be adjusted continuously between this extraction voltage (about 5 kV) and 30 kV relative to the ground potential, by applying a positive voltage to the extraction electrode. The tip voltage is equal to the sum of the ionisation voltage and the extraction voltage. A variable current generator 64 is connected between the high tension lines 33a and 33c to generate a warming current $i_{ch}$ to flow in the wire 50 to locally warm up the apex of the tip to shape it to have a geometry proper for imaging with light ions.

After the sample 5 has been imaged, and a suitable location has been detected with the imaging He ion beam for processing, operation continues with Gas-Field Argon Ion Source (Argon GFIS). The purpose of this operation is to shape the sample 5 using Argon ions, in particular to etch it. The regulation system 11 is used to set operative conditions to a second setting. The valve 16 of the Helium tank 14 is turned off and the valve 16' of the Argon tank 14 is turned on. The vacuum system is set to set the pressure in the chamber at a suitable pressure (same operating range as for He), and the cooling system 17 is set to a suitable operative point. The amount of power to be input on both stages 24, 25 is determined based on the loading graph of the cooling system. For example, the temperature is set in the chamber 45 to an optimum suitable to emit a beam of Argon ions, for example to a temperature of 100 K. In particular, the temperature in the lines 28 and 31 is set above the vaporization temperature of Argon. The Argon gas follows the same path as described above for the Helium gas. The filter 36 is used to filter out impurities from the Argon gas, for example CO, $CO_2$, $O_2$, $H_2O$, and hydrocarbon gases. Argon atoms will condense on the surface of the apex of the tip. The regulation system 11 is further used to apply a voltage difference between the tip 41 and the extraction electrode 42 below the ionization voltage of Helium, for example at about +2 kV-+5 kV. In such way, Helium remaining in the chamber will not be ionized, and only Argon will be ionized, thus forming a beam of Argon ions to shape the substrate 5. If the apparatus comprises a pressure regulation adjustment 58 as shown on FIG. 2, the coupling gas pressure between the cryocooler and the stages can be decreased, thereby minimizing the thermal coupling between the cooling head 18 and the stages, and hence helping the stages to warm up more quickly.

It will be noted that, if the ion source is to be used again for emission of a beam of Helium ions, the regulation system 11 will be used to lower the temperature below the vaporization temperature of Argon. In such way, any Argon remaining in the apparatus will be condensed on the walls, and only Helium will reach the tip to be ionized. Temperature and ionization voltages are thus used to select the species to be ionized, without any risk of contamination of the beam and/or of the sample by an unwanted species previously used in the same system. This seems to be a patentable invention per se and the applicants reserve any rights to protect it independently of the original filing.

Operation can then continue with Atomic Sized Ion Source (ASIS). The purpose of this operation is to shape the sample 5 using metallic ions from the surface of the tip, in particular to deposit such ions on the surface of the sample. The regulation system 11 is used to set operative conditions to a third setting. The valves 16, 16' of the tanks 14, 14' are turned off. The thermal system 17 may be used to keep an overall low temperature in the enclosure, so as to trap any remaining gaseous species (in particular Ar) by condensation on the cold walls. The remaining gas in the enclosure are pumped out as much as possible. The vacuum system is set to set the pressure in the chamber at a suitable pressure (for example about $10^{-10}$ mbar). Because operation in ASIS mode is different from Helium- or Argon-GFIS operation, a calibration step can be employed at this stage to align the new ion beam with respect to the sample. This step can make use of the amplifier 56, as described above.

After the beam has been aligned, and the amplifier is moved away from the path between the tip and the sample, the regulation system 11 is further used to apply a voltage difference between the tip 41 and the extraction electrode 42 to generate an electric field of about 5V/Å. With the wire 50 used to set the potential to the tip, it is also locally warmed by the flow of the current $i_{ch}$. Temperature at the apex of the tip will be brought just below the temperature of liquefaction of the surface material of the tip 41, such as, for example, a few hundreds Kelvin. An overall temperature can be maintained low, while heating only a sub-micrometer thick layer of metal on a tip's apex of reduced spatial extension.

After operation in ASIS mode, the apparatus can be used again in any of the two above GFIS modes, in particular by operating the cooling system again.

In the present embodiment, a suitable metal, such as gold, is deposited on the substrate after it has been imaged by a Helium ion beam and/or etched by an argon ion beam. However, the present invention could be applied when the apparatus is suitable to perform ASIS in combination with only one of the above two GFIS methods.

Operation can alternatively continue from GEIS with Liquid Metal Ion Source (LMIS). The purpose of this operation is to shape the sample 5 using ions from the surface of the tip, in particular to etch the surface of the sample with such ions. The regulation system 11 is used to set operative conditions to a fourth setting. The valves 16, 16' of the tanks 14, 14' are turned off. The remaining gas in the enclosure are pumped out as much as possible. The vacuum system is set to set the pressure in the enclosure at about $10^{-10}$ mbar. Because operation in LMIS mode is different from Helium- or Argon-GEIS operation, a calibration step can be employed at this stage to align the new ion beam with respect to the sample. This step can make use of the amplifier 56, as described above.

After the beam has been aligned, and the amplifier is moved away from the path between the tip and the sample, the regulation system 11 is further used to apply a voltage difference between the tip 41 and the extraction electrode 42 for example at about 2 kV. Temperature at the apex of the tip will locally be brought over the temperature of liquefaction of the surface material of the tip 41, such as, for example, 1300 K (300 K for Gallium). In such way, the layer 53 is liquid and flows under the voltage difference along the core 52 and takes the shape of a Taylor cone (see FIG. 7). High throughput will be obtained. The tip may comprise a reservoir 62 of the metal. Hence, from the point of view of the operating parameters, LMIS operation is similar to ASIS operation with a stronger heating current $i_{ch}$.

After operation in LMIS mode, the apparatus can be used again in any of the two above GFIS modes, in particular by operating the cooling system again. Before operation in GFIS mode, an apex reconstruction procedure can be implemented, so as to shape the tip's apex surface again to be suitable for GFIS emission.

Above, operation in ASIS modes and LMIS modes are presented as alternatives. However, the apparatus could provide for operation alternatively in both modes.

Operation can also be performed with Field Effect Electron Emission. The purpose of this operation is to image the sample 5 using electrons emitted from the surface of the tip. The regulation system 11 is used to set operative conditions to a fifth setting. The vacuum system is set to set the pressure in the chamber at suitable pressure values. The regulation system 11 is further used to apply a suitable voltage difference between the tip 41 and the extraction electrode 42. Of course, this voltage difference is of the sign (polarity) opposite to the above embodiments. A sensor will be used to detect the current flowing between the substrate and the tip, enable thus to obtain information about the substrate's surface.

In particular, it will be noted that the above GFIS, ASIS and electron emission modes make use of the same tip, having an apex which is precisely located in space. Operation can be changed from one mode to another only by changing operating parameters of the source/optics/chamber. LMIS mode will also be applicable with the same tip, with a suitable apex reconstruction (build-up) procedure implemented when much material has been emitted from the tip.

It will be noted that, although the above apparatus is operable in 5 different modes (electronic emission, imaging with low momentum noble ions, etching with high momentum noble ions or metals, deposition of metals (where the optics 8 are also used to brake the ions at arrival on the sample), it seems that some of these modes can be considered as optional, and that some specific combinations of two or more of the above modes in the same apparatus are original. In particular, combination of one GFIS mode with either the LMIS or ASIS mode seems original, and, as mentioned above, combination of the two GFIS modes together seems original.

Further, combination of the electronic emission mode with one or more of the above modes also seems original.

It will also be appreciated that, in variants, if one of the above modes needs not be implemented, some modifications to the apparatus will be readily accessible to the person skilled in the art. For example if only one GFIS mode is to be implemented, there is no need for the two tanks 14 and 14'. If Helium GFIS is not to be implemented, the cooling system may be less sophisticated, to provide higher minimal temperatures. If LMIS is not to be implemented, the structure of the tip 41 may be different (for example, another metal than Gold or Gallium could be used, such as Silver). The above are just few examples of possible apparatus variants.

Figure 9:
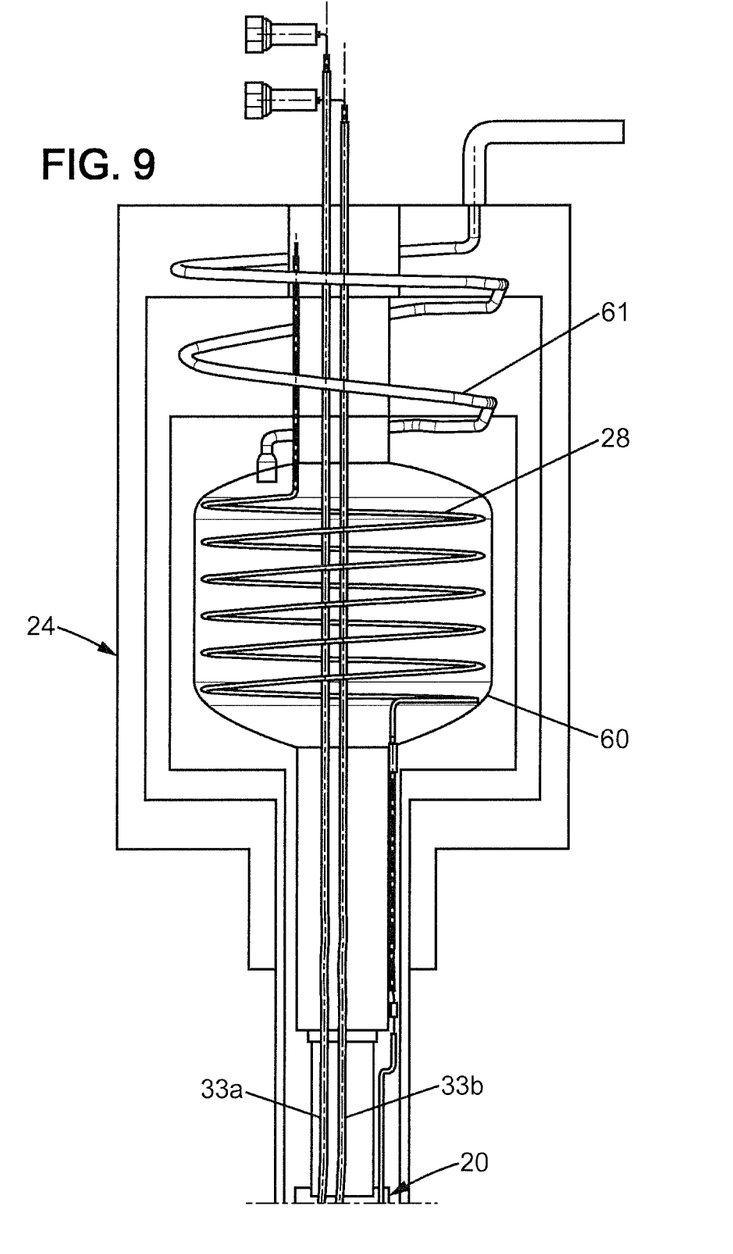
FIG. 9 is a schematic partial sectional view in the same section plane as FIG. 3, for a second embodiment.

A second embodiment will now be described in relation to FIGS. 9-11. The main difference between the first and second embodiments are the nature of the cooling system. Hence, the apparatus according to the second embodiment will also enable the same functions as the one of the first embodiment.

Unlike the first embodiment, which used a mechanical cooling system 17, the second embodiment uses a cryogenic fluid as a cooling medium. As shown in particular on FIG. 9, the enclosure 2 comprises a tank 60 full of cryogenic fluid. This tank 60 will extend from the top of the enclosure 2 to the emission part 20 (only partly shown). The tank 60 is filled with cryogenic fluid from a filling line 61. Depending on the application, the cryogenic fluid will be either liquid Helium or liquid nitrogen, which will affect the minimal temperature reachable with the apparatus.

One interesting difference from the first embodiment is that the electrical lines 33a, 33b, 33c, and the capillary tube 28 pass through the tank 60, working as the first stage 24 of the cooling system.

Figure 10:
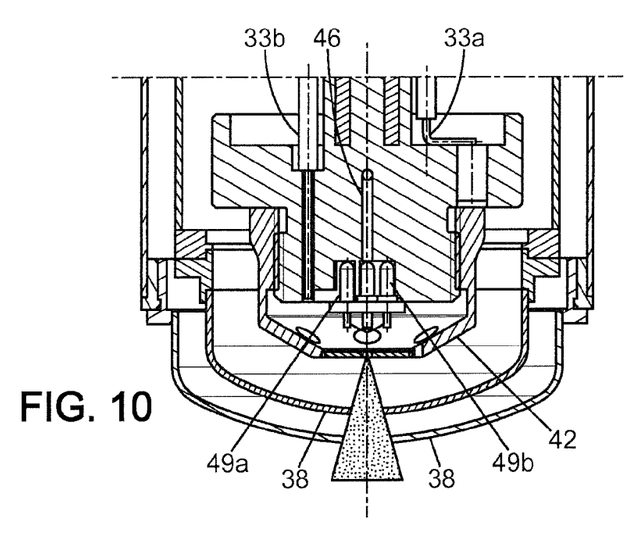
FIGS. 10 and 11 are schematic sectional views of the bottom portion of the second embodiment in respective orthogonal planes.
Figure 11:
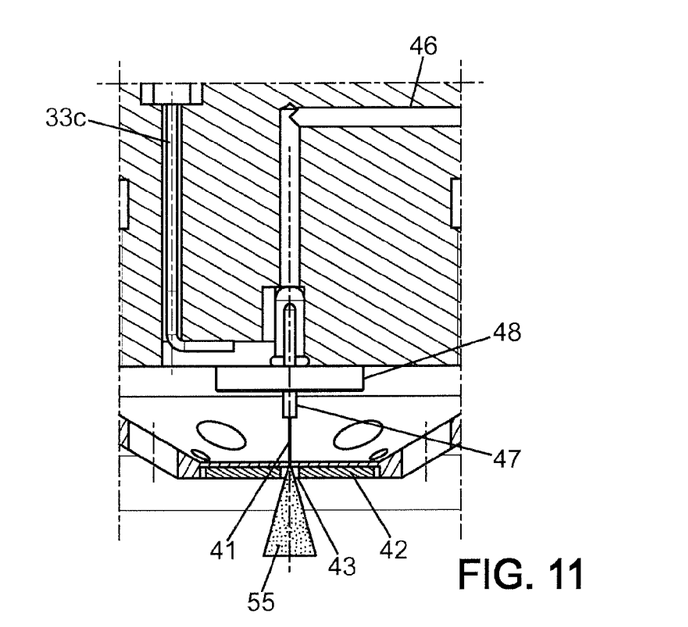

As shown on FIGS. 10 and 11, the channel 46 bringing the gas to the tip 41 is provided as in the first embodiment. The electrical line 33a is connected to the extracting electrode 42 and the two other electrical lines 33b and 33c are connected to the respective electrical contacts 49a, 49b (out of planes).

Operation in the GFIS modes can be performed by selecting a suitable cryogenic fluid to fill the tank 60 with. Operation is ASIS or LMIS mode can be performed after emptying this tank or letting it evaporate.

Remarks:
Imaging using a beam of Helium ions is non-destructive of the sample,
Shapes of a few nanometers of size can be manufactured on the surface of the sample by ASIS, heavy gas GFIS or LMIS,
the ion beam forming system 8 (FIB column) comprises electrostatic lenses able to shape the ion beam. The same system 8 can be used in all of the above ion beam applications, with however different settings for each application—In particular, the beams will be emitted co-linearly,
the beam emission axis can be aligned mechanically and/or electrically with the axis of the electrostatic optics,
the ultimate apex of the tip can comprise a specific shape, such as a specifically-shaped bump of a few atoms, shaped to improve the emission characteristics of the ion beams, and to resist along time,
the support 48, carrying the tube 47, tip 41 and contacts 49a, 49b, will be easily removed and replaced with a similar support having a different tip, whenever necessary,
the temperature of the tip and of the enclosure can be controlled independently and simultaneously,
the tip holder 40 is made of a ceramic material, which resists both to very low and very high temperatures,
thermal sensors can be used in order to control the temperature profile in the enclosure 2—In particular, thermal sensors 63a, 63b, 63c can be provided (FIG. 2) at the first thermal stage, at the second thermal stage, and at the tip holder, respectively—Their information is sent to the regulation system 11,
electrical lines and capillary tubes will be engineered so as to limit the heat they input into the system by conduction and convection—For example, the high voltage lines may be made of a 0.9 mm diameter cupro-nickel core surrounded by a 3 mm diameter Teflon insulator, further surrounded by a 3.6 mm diameter cupro-nickel sheath.

Potential applications include physical control of semi-integrated circuits, during their manufacture or as a final test before commercializing the circuit.

The invention claimed is:

1. An ion source comprising:
a chamber having at least one entry port and one exit aperture,
an injection adapted to inject matter into the chamber through the entry port, wherein said matter comprises at least a first species,
a tip having an apex located in the chamber, wherein the apex has a surface made of a metallic second species,
wherein said first species and said metallic second species have different ionization voltages,
a generator, adapted to apply a voltage to said tip to ionise species inside said chamber, thereby generating ions of said species,
an extractor, adapted to move said ions out from the chamber through the exit aperture,
a regulation system adapted to set operative conditions of the chamber, including at least a temperature and a pressure inside the chamber, and said voltage, to alternatively generate:
in a first operative setting, ions from the gaseous first species,
in a second operative setting, ions from the non-gaseous metallic second species.

2. An ion source according to claim 1, comprising a thermal system, adapted to place the chamber at a temperature,
wherein the first species has a lower vaporization temperature and a higher ionisation voltage than the metallic second species,
wherein the regulation system comprises:
a voltage regulator adapted to set the voltage at least at a first value between the ionisation voltages of the metallic second species and the first species, and at a second value greater than the ionisation voltage of the first species, a temperature regulator, adapted to set the temperature at least at a first value between the vaporization temperature of the first species and the metallic second species and a second value greater than the vaporization temperature of the metallic second species.

3. An ion source according to claim 1, wherein said first species is Helium or Hydrogen.

4. An ion source according to claim 1, wherein said first species if Argon or Neon.

5. An ion source according to claim 1, wherein the top comprises a core covered by a layer of said metallic second species, which is liquid in the second operative setting.

6. An ion source according to claim 1, wherein the apex is made of said metallic second species, which is solid in the second operative setting.

7. An ion source according to claim 1, further comprising a hollow tube carrying the tip and having the first end forming the entry port.

8. An ion source according to claim 1, wherein the injection is adapted to inject matter into the chamber through the entry port, wherein said matter further comprises at least a third species, wherein the regulation system is adapted to set operative conditions of the chamber in a third operative setting to generate ions from the gaseous third species.

9. An ion source according to claim 8, wherein in the first operative setting, the third species if frozen.

10. An ion source according to claim 1, wherein the regulation system is adapted to set operative conditions of the chamber in a fourth operative setting, to generate electrons from the tip, and to move said electrons out from the chamber through the exit aperture.

11. A nanofabrication apparatus comprising:
a sample holder, adapted to receive a sample to be formed,
an ion source according to claim 1,
an electrostatic focusing and scanning charged-particles optics, located between the ion source and the sample holder, operable to guide ions emitted from the source toward the sample holder.

12. A nanofabrication apparatus according to claim 11, wherein ions of the first species are used to image or form the sample received by the sample holder, and wherein ions of the metallic second species are used to form the sample received by the sample holder.

13. A nanofabrication apparatus according to claim 11, further comprising a detecting system adapted to detect the incoming ion beam at the sample holder, the detecting system having a known relative position to the sample, and wherein the regulation system is adapted to set operative conditions of the source and/or the optics based on a detection output from the detecting system.

14. A nanofabrication apparatus according to claim 13, wherein the detection system has an amplifier, adapted to amplify an ion beam from the ion source, and a detector adapted to measure a signal emitted by the amplifier.

15. A method for emitting ions comprising:
providing a chamber having at least one entry port and one exit aperture, and a tip having an apex located in the chamber, wherein the apex has a surface made of a metallic second species,
injecting matter into the chamber through the entry port, wherein said matter comprises at least a first species, wherein said first species and metallic second species have different ionization voltages,
setting operative conditions of the chamber to a first operative setting, including at least a temperature and pressure inside the chamber, and a voltage, to generate ions of said first species,
applying said voltage to said tip to ionise species inside said chamber, thereby generating ions of said gaseous first species,
moving said ions out from the chamber through the exit aperture,
setting operative conditions of the chamber to a second operative setting, including at least a temperature and a pressure inside the chamber, and said voltage, to generate ions of said metallic second species,
applying said tip to ionise species inside said chamber, thereby generating ions of said non-gaseous second species,
moving said ions out from the chamber through the exit aperture.

16. A nanofabrication apparatus according to claims 12, wherein:
ions of the metallic second species are used to form the sample received by the sample holder by etching.

17. A nanofabrication apparatus according to claim 12, wherein:
ions of the metallic second species are used to form the sample received by the sample holder by deposition.

18. A gas-field ion source comprising:
a chamber having at least one entry port and one exit aperture,
an injection adapted to inject matter into the chamber through the entry port, wherein said matter comprises at least a first species which is gaseous under operative conditions,
a hollow tube, the tube having an end being the entry port to the chamber,
a tip, the tip fixed inside the tube so as to allow passage of the gaseous species and extending into the chamber,
a generator, adapted to apply voltage to said tip to ionise species inside said chamber, thereby generating ions of said species,
an extractor, adapted to move said ions out from the chamber through the exit aperture.

19. The gas-field ion source of claim 18, wherein the internal tube diameter is about less than or equal to 100 micrometers.

* * * * *